(12) United States Patent
Hyun et al.

(10) Patent No.: US 9,947,989 B2
(45) Date of Patent: Apr. 17, 2018

(54) ANTENNA FOR COMMUNICATION TERMINAL

(71) Applicant: LG INNOTEK CO., LTD., Seoul (KR)

(72) Inventors: Soon Young Hyun, Seoul (KR); So Yeon Kim, Seoul (KR); Won Ha Moon, Seoul (KR); Seok Bae, Seoul (KR); Nam Yang Lee, Seoul (KR); Hyung Eui Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 57 days.

(21) Appl. No.: 14/401,418

(22) PCT Filed: May 16, 2013

(86) PCT No.: PCT/KR2013/004343
§ 371 (c)(1),
(2) Date: Nov. 14, 2014

(87) PCT Pub. No.: WO2013/172668
PCT Pub. Date: Nov. 21, 2013

(65) Prior Publication Data
US 2015/0138023 A1 May 21, 2015

(30) Foreign Application Priority Data
May 16, 2012 (KR) .................. 10-2012-0051832

(51) Int. Cl.
*H01Q 1/24* (2006.01)
*H01Q 1/38* (2006.01)
(Continued)

(52) U.S. Cl.
CPC ............ *H01Q 1/243* (2013.01); *H01Q 1/38* (2013.01); *H04M 1/026* (2013.01); *H05K 3/202* (2013.01);
(Continued)

(58) Field of Classification Search
CPC ...................................................... H01Q 1/243
(Continued)

(56) References Cited

U.S. PATENT DOCUMENTS

2006/0022886 A1* 2/2006 Hein ................. B82Y 25/00
343/787
2006/0255945 A1* 11/2006 Egbert ............ G06K 19/07771
340/572.7
(Continued)

FOREIGN PATENT DOCUMENTS

CN 101069461 11/2007
CN 101091191 12/2007
(Continued)

OTHER PUBLICATIONS

International Search Report dated Aug. 27, 2013 issued in Application No. PCT/KR2013/004343.
(Continued)

*Primary Examiner* — Daniel J Munoz
(74) *Attorney, Agent, or Firm* — KED & Associates, LLP

(57) ABSTRACT

Provided are an antenna for a communication terminal, and a method of manufacturing the same, the antenna including: a communication terminal case; and a radiator layer formed of a metal material in an inner curved surface part of the communication terminal case.

7 Claims, 6 Drawing Sheets

(51) Int. Cl.
*H05K 3/20* (2006.01)
*H04M 1/02* (2006.01)
*H05K 3/38* (2006.01)

(52) U.S. Cl.
CPC ....... *H05K 3/386* (2013.01); *H05K 2201/086* (2013.01); *H05K 2201/09018* (2013.01); *H05K 2201/10098* (2013.01)

(58) Field of Classification Search
USPC .................................................. 343/787, 788
See application file for complete search history.

(56) References Cited

U.S. PATENT DOCUMENTS

| | | | |
|---|---|---|---|
| 2007/0252771 | A1 | 11/2007 | Maezawa et al. |
| 2008/0191028 | A1 | 8/2008 | Kagaya et al. |
| 2009/0051616 | A1* | 2/2009 | Hong ................... H01Q 1/1207 343/872 |
| 2009/0096413 | A1 | 4/2009 | Partovi et al. |
| 2011/0068984 | A1 | 3/2011 | Han et al. |
| 2011/0254745 | A1 | 10/2011 | Tsujimura et al. |
| 2011/0279333 | A1* | 11/2011 | Hong ...................... H01Q 5/40 343/702 |
| 2013/0234899 | A1* | 9/2013 | Pope ...................... H01Q 1/243 343/702 |

FOREIGN PATENT DOCUMENTS

| | | |
|---|---|---|
| CN | 102142597 A | 8/2011 |
| EP | 1 814 191 A2 | 8/2007 |
| JP | 2005-333244 A | 12/2005 |
| JP | 2006-190181 A | 7/2006 |
| JP | 2008-301295 A | 12/2008 |
| KR | 10-2011-0032316 A | 3/2011 |
| KR | 10-2011-0097415 A | 8/2011 |
| TW | 200943625 | 10/2009 |

OTHER PUBLICATIONS

European Search Report dated Jan. 20, 2016 issued in Application No. 13791423.0.
Chinese Office Action dated Jan. 26, 2016 issued in Application No. 201380031842.7 (English Translation attached).
Chinese Office Action dated Aug. 16, 2016 issued in Application No. 201380031842.7 (with English translation).
Taiwanese Office Action (with Full English Translation) dated Jul. 20, 2017 issued in Application No. 102117384.

* cited by examiner

【Fig. 1】
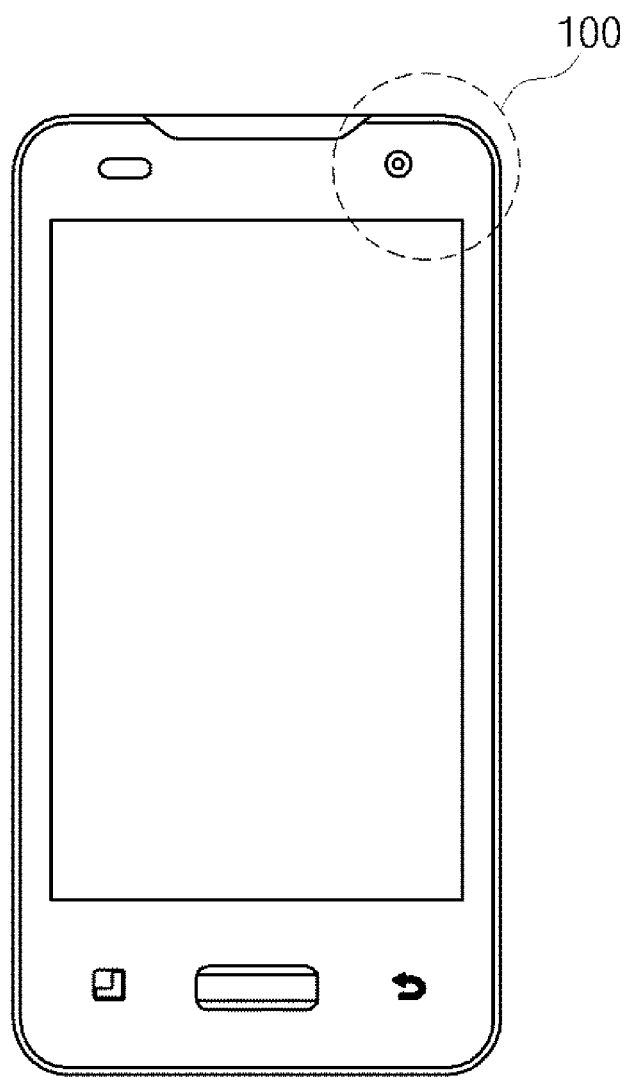

[Fig. 2]
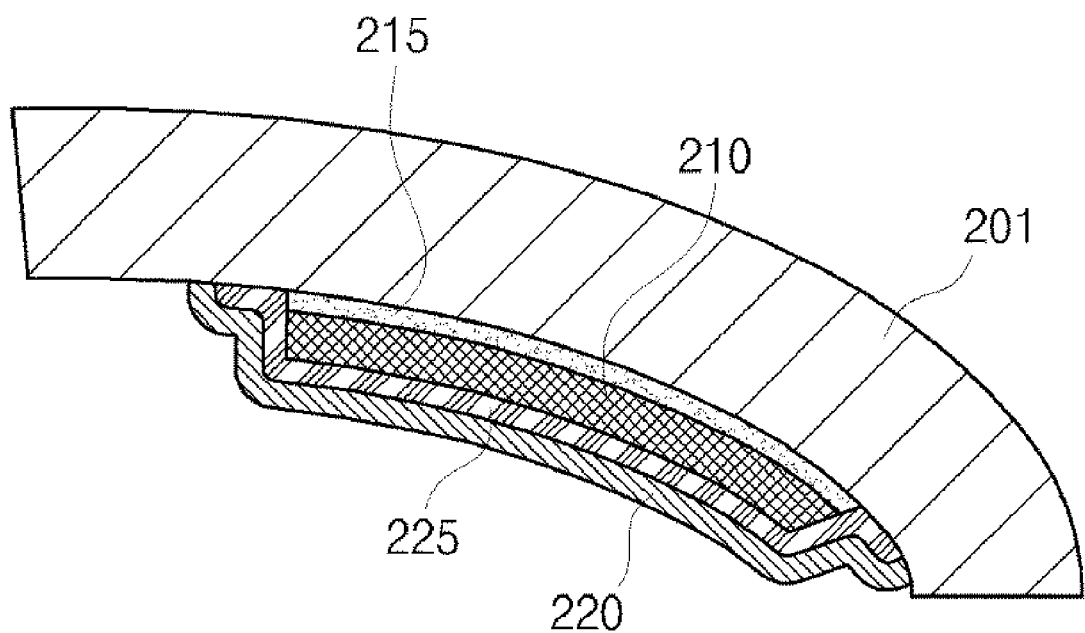

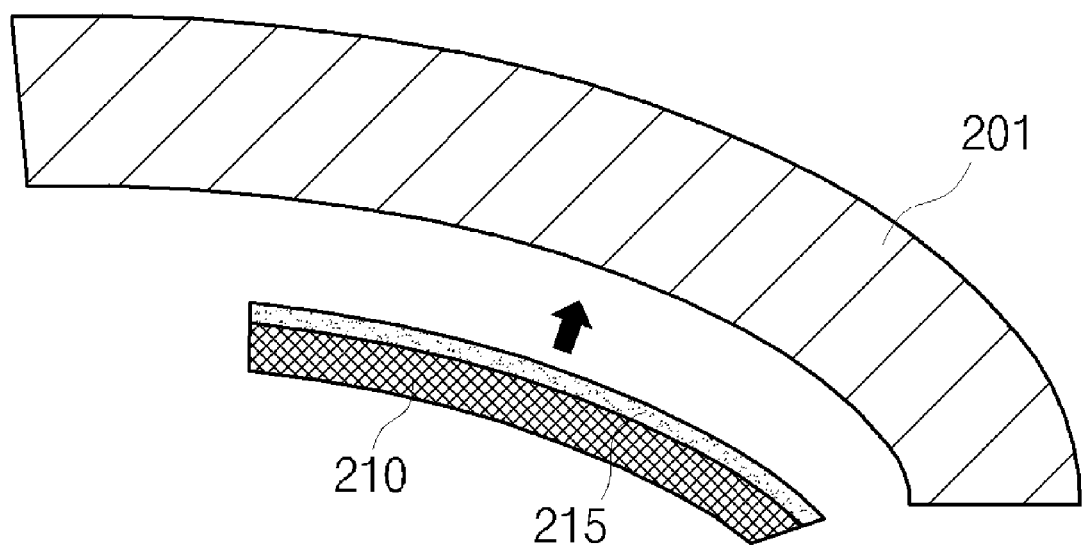
[Fig. 3]

[Fig. 4]
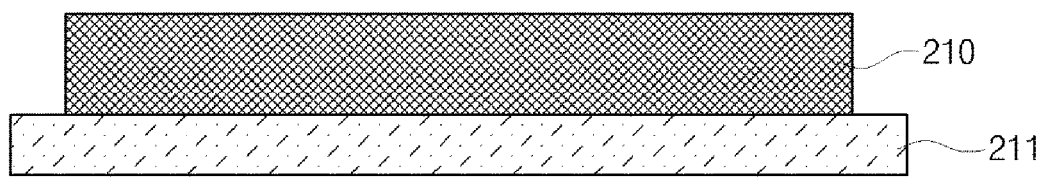
[Fig. 5]
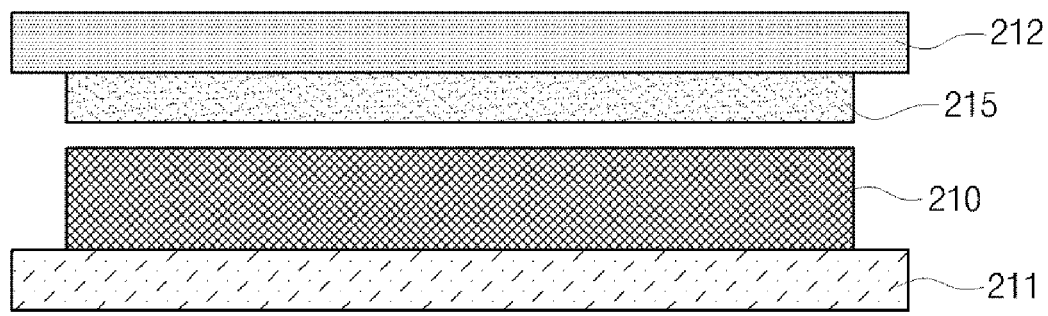
[Fig. 6]
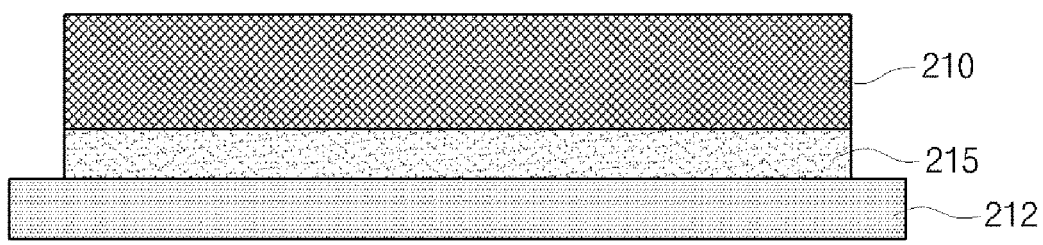

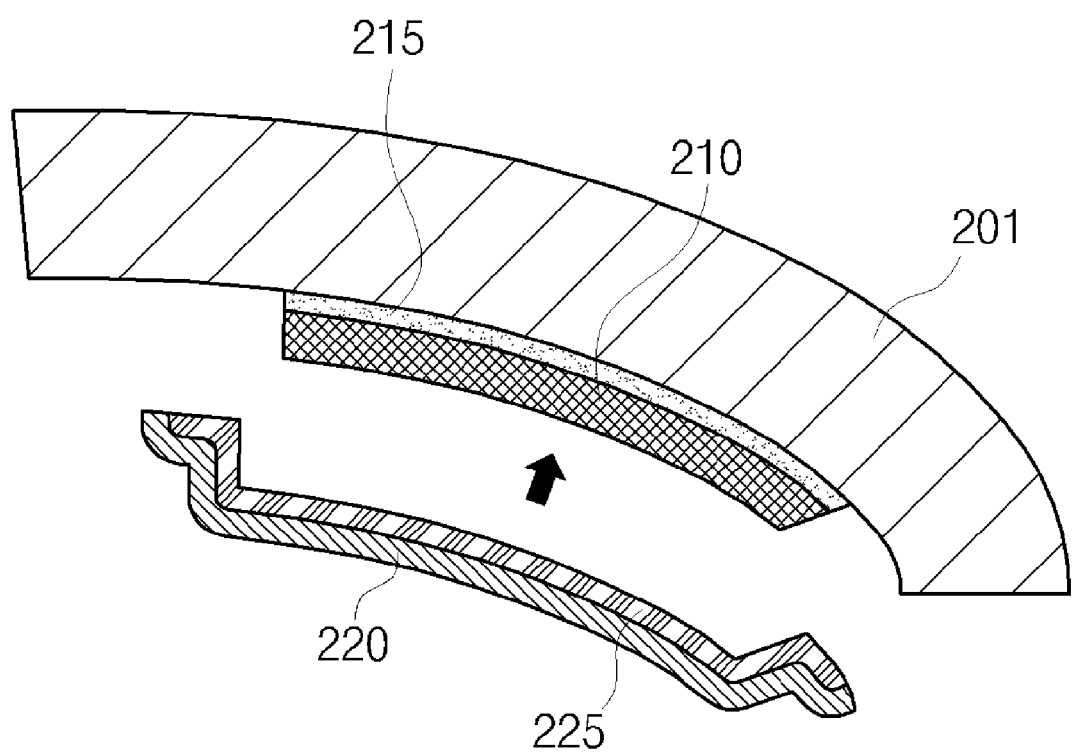
[Fig. 7]

[Fig. 8]
[Fig. 9]
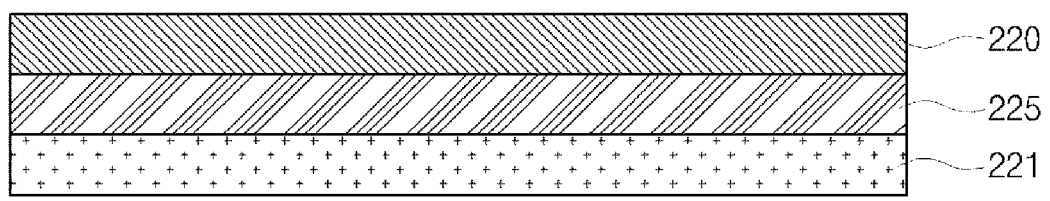
[Fig. 10]
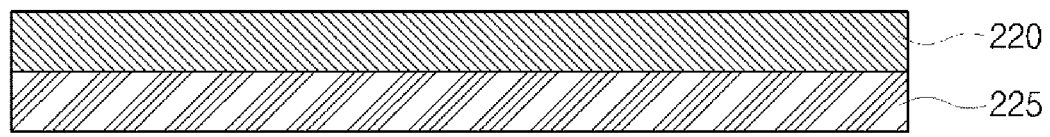

ANTENNA FOR COMMUNICATION TERMINAL

CROSS-REFERENCE TO RELATED PATENT APPLICATIONS

This application is a U.S. National Stage Application under 35 U.S.C. § 371 of PCT Application No. PCT/KR2013/004343, filed May 16, 2013, which claims priority to Korean Patent Application No. 10-2012-0051832, filed May 16, 2012, whose entire disclosures are incorporated herein by reference.

BACKGROUND OF THE INVENTION

Field of the Invention

The present invention relates to an antenna for a communication terminal and a method of manufacturing the same, and more specifically, to an antenna for a communication terminal, which is formed in an inner curved surface part of a communication terminal case, and a method of manufacturing the same.

Description of the Related Arts

In general, a communication terminal has an antenna for communication. According to a function of the communication terminal, various antennas such as a DMB antenna, a navigation antenna and the like are provided in the communication terminal.

Among these antennas, a communication antenna is embedded in an inner part of the communication terminal, and a DMB or navigation antenna is installed to protrude to the outside or is configured to be fixed to the body of a cellular phone in a separate accessory form.

Recently, an antenna mounted to a rear surface of a communication terminal case rather than a separate antenna module has been widely used. It is problematic that since a curved surface is present in an antenna installation part of the rear surface of the case, it would be difficult to form a conductor.

Accordingly, in order to mount the antenna to the rear surface of the case, an in-mold injection technology or an LDS (laser direct structuring) technology has been used.

The in-mold injection technology is a technology including a part which prints a surface of an injection molding product by transferring a transfer film such as a printed circuit board on the surface of the injection molding product during an injection molding process of the product, namely, a technology for printing and controlling the transfer film in the molding product to be molded. The LDS (Laser Direct Structuring) technology is a technology for producing a circuit capable of performing a function of the antenna by forming a pattern on resin using a laser, and thereafter, plating the pattern with Cu, Ni or Au.

However, when the antenna is produced using the in-mold injection method or LDS (Laser Direct Structuring) method, in spite of high manufacturing costs, it is problematic that mechanical strength of the antenna is low and a defective rate is high.

SUMMARY OF THE INVENTION

The present invention has been made keeping in mind the above problems. An aspect of the present invention provides an antenna for a communication terminal, which is configured such that a radiator layer formed of a metal material is formed in an inner part of a communication terminal case, and a magnetic layer formed of a magnetic material composition containing a magnetic material powder and a binder resin is formed on a surface of the radiator layer, so that the antenna can be formed and disposed in an inner curved surface part of the communication terminal case.

According to an aspect of the present invention, there is provided an antenna for a communication terminal, including: a communication terminal case; and a radiator layer formed of a metal material in an inner curved surface part of the communication terminal case.

In accordance with one exemplary embodiment of the present invention, the radiator layer may be configured in an antenna patterning shape using the metal material.

In accordance with another exemplary embodiment of the present invention, the antenna may further include a first adhesive material layer for bonding the radiator layer to the communication terminal case.

In accordance with still another exemplary embodiment of the present invention, the first adhesive material layer may be composed of a PSA (Pressure Sensitive Adhesive) or a hot melt adhesive material.

In accordance with still another exemplary embodiment of the present invention, the metal material may be any one of Cu, Ag, Au and Al.

In accordance with still another exemplary embodiment of the present invention, the antenna may further include a magnetic layer formed of a magnetic material composition containing a magnetic material powder and a binder resin on a surface of the radiator layer.

In accordance with still another exemplary embodiment of the present invention, the antenna may further include a second adhesive material layer for bonding the magnetic layer onto the radiator layer.

In accordance with still another exemplary embodiment of the present invention, the second adhesive material layer is composed of a PSA (Pressure Sensitive Adhesive) or a hot melt adhesive material.

In accordance with still another exemplary embodiment of the present invention, the magnetic material powder may be one element or an alloy of a combination of two or elements selected from the group consisting of Fe, Ni, Co, Mn, Al, Zn, Cu, Ba, Ti, Sn, Sr, P, B, N, C, W, Cr, Bi, Li, Y and Cd, or ferrite powder.

In accordance with still another exemplary embodiment of the present invention, the binder resin may be one resin or a mixture of two or more resins selected from the group consisting of a polyvinyl alcohol-based resin, a silicon-based resin, an epoxy-based resin, an acrylate-based resin, a urethane-based resin, a polyamide-based resin and a polyimide-based resin.

In accordance with still another exemplary embodiment of the present invention, the magnetic material composition may contain an additive agent, which is mixed in the binder resin, in an amount of less than 2% based on a total weight of the composition.

In accordance with still another exemplary embodiment of the present invention, the additive agent may be a silane coupling agent, a defoaming agent or a cross-linking agent.

According to another aspect of the present invention, there is provided a method of manufacturing an antenna for a communication terminal, the method including: forming a radiator layer on a first substrate using a metal material; forming a first adhesive material layer on a surface of the radiator layer; a second substrate in an upper part of the first adhesive material layer; removing the first substrate; and removing the second substrate, whereby the radiator layer is bonded to an inner curved surface part of a communication terminal case by the first adhesive material layer.

In accordance with one exemplary embodiment of the present invention, the forming of the radiator layer may be performed in such a manner that the radiator layer is configured in an antenna patterning shape using the metal material.

In accordance with another exemplary embodiment of the present invention, the bonding of the radiator layer to the inner curved surface part of the communication terminal case may be performed in such a manner that the first adhesive material layer is composed of a hot melt adhesive material, and the communication terminal case corresponding to a rear surface of the radiator layer is cooled.

In accordance with still another exemplary embodiment of the present invention, the method may further include forming a magnetic layer using a magnetic material composition containing a magnetic material powder and a binder resin, and bonding the magnetic layer onto a surface of the radiator layer.

In accordance with still another exemplary embodiment of the present invention, the forming of the magnetic layer may be performed by compressing or coating the magnetic material composition containing the magnetic material powder and the binder resin on a substrate and heat-curing or sintering the magnetic material composition, and defoaming the magnetic material composition.

In accordance with still another exemplary embodiment of the present invention, the bonding of the magnetic layer onto the radiator layer may be performed in such a manner that the second adhesive material layer formed on a cover substrate is bonded onto the magnetic layer, the cover substrate is removed so that the second adhesive material layer is bonded onto the magnetic layer, and the magnetic layer is bonded onto the surface of the radiator layer by the second adhesive material layer.

In accordance with still another exemplary embodiment of the present invention, the bonding of the magnetic layer onto the surface of the radiator layer may be performed in such a manner that the magnetic layer is bonded onto the surface of the radiator layer using the second adhesive layer.

In accordance with still another exemplary embodiment of the present invention, the bonding of the magnetic layer onto the surface of the radiator layer may be performed in such a manner that the second adhesive material layer is composed of the hot melt adhesive material, and the communication terminal case corresponding to the rear surface of the radiator layer is cooled.

According to the present invention, unlike the conventional in-mold injection method or LDS (Laser Direct Structuring) method in which the antenna is not formed on the curved surface of the inner part of the case, although the inner part of the communication terminal case is configured in a curved surface, the antenna can be formed and disposed.

Also, according to the present invention, the antenna for the communication terminal is configured such that the antenna is separated from an inner B/D and is bonded to the inner part of the communication terminal case, thereby enabling communication efficiency of the antenna to be improved.

Also, according to the present invention, as the antenna for the communication terminal is configured using the magnetic layer formed of the magnetic material composition, a size of the antenna can be reduced, and a performance thereof can be more improved by increasing a bandwidth and a gain.

Also, according to the present invention, when the magnetic layer which composes the antenna for the communication terminal is composed of ferrite powder, it would be possible to perform wireless charging.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 1 is a view illustrating a communication terminal according to one exemplary embodiment of the present invention;

FIG. 2 is a cross-sectional view showing an antenna for a communication terminal according to the one exemplary embodiment of the present invention; and FIG. 3 through FIG. 10 are views for explaining a method of manufacturing the antenna for the communication terminal according to the one exemplary embodiment.

DETAILED DESCRIPTION OF THE INVENTION

Exemplary embodiment according to the present invention will now be described more fully hereinafter with reference to the accompanying drawing. The exemplary embodiment of the present invention may, however, be embodied in many different forms and should not be construed as limited to the embodiment set forth herein. Rather this exemplary embodiment is provided so that this disclosure will be thorough and complete, and will fully convey the scope of the invention to those skilled in the art. In the following description, it is to be noted that, when the functions of conventional elements and the detailed description of elements related with the present invention may make the gist of the present invention unclear, a detailed description of those elements will be omitted. Also, it should be understood that the shape and size of the elements shown in the drawings may be exaggeratedly drawn to provide an easily understood description of the structure of the present invention.

FIG. 1 is a communication terminal according to one exemplary embodiment of the present invention. FIG. 2, which is a cross-sectional view showing an antenna for a communication terminal according to the one exemplary embodiment of the present invention, illustrates a cross-section of one side of the communication terminal illustrated in FIG. 1.

The configuration of an antenna for a communication terminal according to the one exemplary embodiment will be hereinafter explained with reference to FIG. 2.

As illustrated in FIG. 2, the antenna for the communication terminal according to the one exemplary embodiment of the present invention may composed of a communication terminal case 201 and a radiator layer 210 formed in an inner curved surface part of the communication terminal case, and may further include a magnetic layer 220, a first adhesive material layer 215 and a second adhesive material layer 225.

The radiator layer 210 is formed in an inner part of the communication terminal case 201 using a metal material, and the radiator layer 210 is antenna-patterned. At this time, any one of Cu, Ag, Au and Al may be used as the metal material which composes the radiator layer 210. The radiator layer 210 may be formed in a thickness of 1 to 200 μm.

The first adhesive material layer 215 is used so that the radiator layer 210 is bonded to an inner part of the communication terminal case 201.

A pressure sensitive adhesive (PSA) or a hot melt adhesive material may be used as the first adhesive material layer 215 for bonding the radiator layer 210 to the communication terminal case 201.

In a case where the PSA is used as the first adhesive material layer 215, the PSA may bond the radiator layer 210 to the communication terminal case using pressure. At this time, a pressure of 0.2 to 5 kgf/cm$^2$ may be applied.

Also, when the hot melt adhesive material is used as the first adhesive material layer 215, a heat block of about 40 to 80° C. is applied to the radiator layer 210, and a cold system is applied to the communication terminal case 201 corresponding to a rear surface of the radiator layer 210. Like this, the reason why the cool system is applied thereto is to prevent the communication terminal case 201 from being modified due to the heat block in a case where the communication terminal case 201 is composed of a material such as polycarbonate. At this time, an electronic cool system using a thermoelement may be used as the cool system.

The magnetic layer 220 is formed on the radiator layer 210 which is formed as described above.

The magnetic layer 220 is formed of a magnetic material composition containing a magnetic material power and a binder resin. More specifically, the magnetic material powder may be composed of one element or an alloy of a combination of two or more elements selected from the group consisting of Fe, Ni, Co, Mn, Al, Zn, Cu, Ba, Ti, Sn, Sr, P, B, N, C, W, Cr, Bi, Li, Y and Cd, or ferrite powder. The binder resin may be composed of one resin or a mixture of two or more resins selected from the group consisting of a polyvinyl alcohol-based resin, a silicon-based resin, an epoxy-based resin, an acrylate-based resin, a urethane-based resin, a polyamide-based resin, and a polyimide-based resin. At this time, the binder resin contains an additive agent, which is mixed in the binder resin, in an amount of less than 2% based on a total weight of the composition. A silane coupling agent, a defoaming agent or a cross-linking agent may be used as the additive agent.

The second adhesive material layer 225 is used so that the magnetic layer 220 is bonded onto the radiator layer 210.

Like the first adhesive material layer 215, the PSA (pressure sensitive adhesive) or the hot melt adhesive material may be used as the second adhesive material layer 225 for bonding the magnetic layer 220 onto the radiator layer 210.

In a case where the PSA is used as the second adhesive material layer 225, the PSA may bond the magnetic layer 220 to the communication terminal case using pressure. At this time, a pressure of 0.2 to 5 kgf/cm$^2$ may be applied.

Also, when the hot melt adhesive material is used as the second adhesive material layer 225, the heat block of about 40 to 80° C. is applied to the first adhesive material layer 215, and the cold system is applied to the communication terminal case 201 corresponding to the rear surface of the magnetic layer 220. The reason why the cold system is applied thereto is to prevent the communication terminal case 201 from being modified due to the heat block when the communication terminal case 201 is composed using a material such as polycarbonate. At this time, the electronic cool system using the thermoelement may be used as the cool system.

FIG. 3 through FIG. 10 are views for explaining a method of manufacturing the antenna for the communication terminal according to the one exemplary embodiment. More specifically, FIG. 3 through FIG. 6 are views for explaining a method of forming the radiator layer according to the one exemplary embodiment. FIG. 7 through FIG. 10 are views for explaining a method of forming the magnetic layer according to the one exemplary embodiment of the present invention.

According to the one exemplary embodiment of the present invention, as illustrated in FIG. 3, the radiator layer 210 is formed, and the radiator layer 210, which is formed, is bonded to an inner curved surface part of the communication terminal case 210 by the first adhesive material layer 215.

The method of forming the radiator layer 210 will be more specifically explained with reference to FIG. 4 to FIG. 6.

As illustrated in FIG. 4, the radiator layer 210 is formed on a first substrate 211 using a metal material. A stainless steel may be used as a material of the first substrate 211. Any one of Cu, Ag, Au and Al may be used as the metal material which composes the radiator layer 210. The radiator layer may be formed in a thickness of 1 to 200 μm.

After this, as illustrated in FIG. 5, the first adhesive material layer 215 formed on a second substrate 212 is bonded on the radiator layer 210 which is formed as described above. At this time, PET may be used as the second substrate 212.

Also, as illustrated in FIG. 6, the radiator layer 210 is transferred onto the first adhesive material layer 215 formed on the second substrate 212, and the first substrate 211 is removed.

After this, the second substrate 212 is removed, and as illustrated in FIG. 3, the radiator layer 210 is bonded to the inner curved surface part of the communication terminal case 201 by the first adhesive material layer 215.

According to the one exemplary embodiment of the present invention, the magnetic layer 220 is formed on the radiator layer 210 formed as illustrated in FIG. 7.

The method of forming the magnetic layer 220 will be more specifically explained with reference to FIG. 8 to FIG. 10.

As illustrated in FIG. 8, the magnetic layer 220 is formed. At this time, the magnetic layer 220 is formed of the magnetic material composition containing the magnetic material powder and the binder resin. The additive agent mixed in the binder resin is contained in the amount of less than 2% based on a total weight of the magnetic material composition. A defoaming process for the magnetic material composition is carried out.

After this, a pressure of 10 to 1000 kgf/cm$^2$ is applied to the magnetic material composition or the magnetic material composition is coated on the substrate, and thereafter, a defoaming process for the magnetic material composition is again carried out.

After this, the magnetic layer 220 is formed by heat-curing or sintering the magnetic material composition.

After this, as illustrated in FIG. 9, the second adhesive material layer 225 formed on a cover substrate 221 is bonded onto the magnetic layer 220.

After this, as illustrated in FIG. 10, the second adhesive material layer 225 is bonded onto the magnetic layer 220 by removing the cover substrate 221.

Furthermore, as illustrated in FIG. 7, the magnetic layer 220 is bonded onto a surface of the radiator layer 210 by the second adhesive material layer 225.

At this time, when the magnetic layer 220 is bonded onto the surface of the radiator layer 210, and the PSA (pressure sensitive adhesive) is used as the second adhesive material layer 225, the magnetic layer is bonded onto the surface of the radiator layer due to the PSA by applying a regular pressure thereto. Also, when the hot melt adhesive material is used as the second material layer 225, a cold system is applied so that the communication terminal case 201 corresponding to the rear surface of the radiator layer 210 is cooled, thereby preventing the communication terminal case 201 from being modified.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. An antenna for a communication terminal, comprising:
   a communication terminal case;
   a radiator layer provided on a curved portion of an inner curved surface of the communication terminal case and formed in an antenna pattern using a metal material;
   a first adhesive material layer that provided between the curved portion of the inner curved surface of the communication terminal case and the radiator layer;
   a magnetic layer including magnetic powder and binder resin, the binder resin containing an additive agent mixed in the binder resin in an amount of less than 2% based on a total weight of the binder resin and the additive agent, wherein the additive agent is any one of a silane coupling agent, a defoaming agent, or a cross-linking agent; and
   a second adhesive material layer provided between the magnetic layer and the radiator layer, wherein the second adhesive material layer is provided along an upper surface of the radiator layer, a side surface of the radiator layer and a side surface of the first adhesive material layer so as to surround the radiator layer and the first adhesive layer,
   wherein the magnetic layer is provided along an upper surface of the second material adhesive layer,
   wherein both ends of the magnetic layer and both ends of the second adhesive layer directly contact the inner curved surface of the communication terminal case,
   wherein both ends of the magnetic layer and both ends of the second adhesive layer have a stepped portion,
   wherein the first adhesive material layer contains a hot melt adhesive material and a heat block of 40 to 80° C. is applied to the radiator layer, and a thermoelement is applied to the communication terminal case corresponding to a bottom surface of the radiator layer, and
   wherein the second adhesive material layer contains a hot melt adhesive material and a heat block of 40 to 80° C. is applied to the magnetic layer, and the thermoelement is applied to the communication terminal case corresponding to a bottom surface of the magnetic layer.

2. The antenna according to claim 1, wherein the first adhesive layer and one end of the second adhesive layer come into contact with each other.

3. The antenna according to claim 1, wherein the radiator layer and the magnetic layer are configured not to come into contact with each other.

4. The antenna according to claim 1, wherein the magnetic powder is one element or an alloy of a combination of two or more elements selected from the group consisting of Fe, Ni, Co, Mn, Al, Zn, Cu, Ba, Ti, Sn, Sr, P, B, N, C, W, Cr, Bi, Li, Y and Cd.

5. The antenna according to claim 1, wherein the magnetic powder is one element or ferrite powder of a combination of two or more elements selected from the group consisting of Fe, Ni, Co, Mn, Al, Zn, Cu, Ba, Ti, Sn, Sr, P, B, N, C, W, Cr, Bi, Li, Y and Cd.

6. The antenna according to claim 1, wherein the binder resin is one resin or a mixture of two or more resins selected from the group consisting of a polyvinyl alcohol based-resin, a silicon-based resin, an epoxy-based resin, an acrylate-based resin, an urethane-based resin, a polyamide-based resin and a polyimide-based resin.

7. The antenna according to claim 1, wherein the magnetic layer and second adhesive layer cover both ends of the radiator layer while contacting the inner curved surface of the communication terminal case.

* * * * *